US006998847B2

(12) United States Patent
Bertness et al.

(10) Patent No.: US 6,998,847 B2
(45) **Date of Patent: *Feb. 14, 2006**

(54) ELECTRONIC BATTERY TESTER WITH DATA BUS FOR REMOVABLE MODULE

(75) Inventors: Kevin I. Bertness, Batavia, IL (US); Stephen J. McShane, Oak Brook, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/883,019

(22) Filed: Jul. 1, 2004

(65) Prior Publication Data

US 2005/0001626 A1 Jan. 6, 2005

Related U.S. Application Data

(60) Division of application No. 10/280,186, filed on Oct. 25, 2002, now Pat. No. 6,759,849, which is a continuation-in-part of application No. 09/816,768, filed on Mar. 23, 2001, now Pat. No. 6,586,941.

(60) Provisional application No. 60/192,222, filed on Mar. 27, 2000.

(51) Int. Cl.
*G01N 27/416* (2006.01)

(52) U.S. Cl. .................................................... 324/426

(58) Field of Classification Search ................ 324/426, 324/427, 430, 433
See application file for complete search history.

(56) References Cited

U.S. PATENT DOCUMENTS

| | | | | |
|---|---|---|---|---|
| 2,000,665 A | | 5/1935 | Neal | 439/440 |
| 2,514,745 A | | 7/1950 | Dalzell | 324/115 |
| 3,356,936 A | | 12/1967 | Smith | 324/429 |
| 3,562,634 A | | 2/1971 | Latner | 324/427 |
| 3,593,099 A | | 7/1971 | Scholl | 320/127 |
| 3,607,673 A | | 9/1971 | Seyl | 324/425 |
| 3,652,341 A | | 3/1972 | Halsall et al. | 20/623.2 |
| 3,676,770 A | | 7/1972 | Sharaf et al. | 324/430 |
| 3,729,989 A | | 5/1973 | Little | 73/862.192 |
| 3,750,011 A | | 7/1973 | Kreps | 324/430 |
| 3,753,094 A | | 8/1973 | Furuishi et al. | 324/430 |
| 3,796,124 A | | 3/1974 | Crosa | 411/521 |
| 3,808,522 A | | 4/1974 | Sharaf | 324/430 |
| 3,811,089 A | | 5/1974 | Strezelewicz | 324/170 |
| 3,873,911 A | | 3/1975 | Champlin | 324/430 |
| 3,876,931 A | | 4/1975 | Godshalk | 324/429 |
| 3,886,443 A | | 5/1975 | Miyakawa et al. | 324/426 |
| 3,889,248 A | | 6/1975 | Ritter | 340/636 |
| 3,906,329 A | | 9/1975 | Bader | 320/134 |
| 3,909,708 A | | 9/1975 | Champlin | 324/431 |
| 3,936,744 A | | 2/1976 | Perlmutter | 324/772 |
| 3,946,299 A | | 3/1976 | Christianson et al. | 320/430 |
| 3,947,757 A | | 3/1976 | Grube et al. | 324/416 |
| 3,969,667 A | | 7/1976 | McWilliams | 324/427 |
| 3,979,664 A | | 9/1976 | Harris | 324/397 |
| 3,984,762 A | | 10/1976 | Dowgiallo, Jr. | 324/430 |
| 3,984,768 A | | 10/1976 | Staples | 324/712 |
| 3,989,544 A | | 11/1976 | Santo | 429/65 |
| 4,008,619 A | | 2/1977 | Alcaide et al. | 73/724 |
| 4,023,882 A | | 5/1977 | Pettersson | 439/426 |
| 4,024,953 A | | 5/1977 | Nailor, III | 206/344 |
| 4,047,091 A | | 9/1977 | Hutchines et al. | 363/59 |
| 4,053,824 A | | 10/1977 | Dupuis et al. | 324/434 |
| 4,056,764 A | | 11/1977 | Endo et al. | 320/101 |
| 4,070,624 A | | 1/1978 | Taylor | 324/772 |
| 4,086,531 A | | 4/1978 | Bernier | 324/772 |
| 4,112,351 A | | 9/1978 | Back et al. | 324/380 |
| 4,114,083 A | | 9/1978 | Benham et al. | 320/150 |
| 4,126,874 A | | 11/1978 | Suzuki et al. | 396/301 |
| 4,160,916 A | | 7/1979 | Papasideris | 307/10.6 |
| 4,178,546 A | | 12/1979 | Hulls et al. | 324/772 |
| 4,193,025 A | | 3/1980 | Frailing et al. | 324/427 |
| 4,207,611 A | | 6/1980 | Gordon | 324/503 |
| 4,217,645 A | | 8/1980 | Barry et al. | 702/63 |
| 4,280,457 A | | 7/1981 | Bloxham | 123/198 |
| 4,297,639 A | | 10/1981 | Branham | 324/429 |
| 4,307,342 A | * | 12/1981 | Peterson | 324/767 |
| 4,315,204 A | | 2/1982 | Sievers et al. | 322/28 |
| 4,316,185 A | | 2/1982 | Watrous et al. | 320/116 |
| 4,322,685 A | | 3/1982 | Frailing et al. | 324/429 |
| 4,351,405 A | | 9/1982 | Fields et al. | 180/65.2 |
| 4,352,067 A | | 9/1982 | Ottone | 324/434 |
| 4,360,780 A | | 11/1982 | Skutch, Jr. | 324/437 |
| 4,361,809 A | | 11/1982 | Bil et al. | 324/426 |
| 4,363,407 A | | 12/1982 | Buckler et al. | 209/3.3 |
| 4,369,407 A | | 1/1983 | Korbell | 324/416 |
| 4,379,989 A | | 4/1983 | Kurz et al. | 320/165 |
| 4,379,990 A | | 4/1983 | Sievers et al. | 322/99 |
| 4,385,269 A | | 5/1983 | Aspinwall et al. | 320/129 |

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward H. Tso
(74) *Attorney, Agent, or Firm*—Westman, Champlin & Kelly P.A.

(57) ABSTRACT

An electronic battery tester is provided for testing storage batteries. Battery test circuitry is configured to couple to the storage battery and measure a condition of the battery. A removable module is configured to couple to the battery tester to add increased functionality.

30 Claims, 4 Drawing Sheets

U.S. PATENT DOCUMENTS 4,390,828 A 6/1983 Converse et al. ........... 320/153
4,392,101 A 7/1983 Saar et al. .................. 320/156
4,396,880 A 8/1983 Windebank ................. 320/156
4,408,157 A 10/1983 Beaubien .................... 324/712
4,412,169 A 10/1983 Dell'Orto ................... 320/123
4,423,378 A 12/1983 Marino et al. ............. 324/427
4,423,379 A 12/1983 Jacobs et al. ............... 324/429
4,424,491 A 1/1984 Bobbett et al. ............. 324/433
4,459,548 A 7/1984 Lentz et al. ................ 324/772
4,514,694 A 4/1985 Finger ........................ 324/429
4,520,353 A 5/1985 McAuliffe .................. 340/636
4,564,798 A 1/1986 Young ........................ 320/103
4,620,767 A 11/1986 Woolf ........................ 439/217
4,633,418 A 12/1986 Bishop ........................ 702/63
4,659,977 A 4/1987 Kissel et al. ................ 320/150
4,663,580 A 5/1987 Wortman .................... 320/153
4,665,370 A 5/1987 Holland ...................... 324/429
4,667,143 A 5/1987 Cooper et al. .............. 320/153
4,667,279 A 5/1987 Maier .......................... 363/46
4,678,998 A 7/1987 Muramatsu ................. 324/427
4,679,000 A 7/1987 Clark ......................... 324/428
4,680,528 A 7/1987 Mikami et al. ............. 320/165
4,686,442 A 8/1987 Radomski ................... 320/123
4,697,134 A 9/1987 Burkum et al. ............ 320/134
4,707,795 A 11/1987 Alber et al. .................. 702/63
4,709,202 A 11/1987 Koenck et al. ............. 320/112
4,710,861 A 12/1987 Kanner ........................ 363/46
4,719,428 A 1/1988 Liebermann ................ 324/436
4,723,656 A 2/1988 Kiernan et al. ............. 206/705
4,743,855 A 5/1988 Randin et al. .............. 324/430
4,745,349 A 5/1988 Palanisamy et al. ........ 320/125
4,816,768 A 3/1989 Champlin ................... 324/428
4,820,966 A 4/1989 Fridman ..................... 320/116
4,825,170 A 4/1989 Champlin ................... 324/436
4,847,547 A 7/1989 Eng, Jr. et al. ............. 320/153
4,849,700 A 7/1989 Morioka et al. ............ 324/427
4,874,679 A 10/1989 Miyagawa ................... 429/91
4,876,495 A 10/1989 Palanisamy et al. ........ 320/106
4,881,038 A 11/1989 Champlin ................... 324/426
4,888,716 A 12/1989 Ueno .......................... 702/63
4,912,416 A 3/1990 Champlin ................... 324/430
4,913,116 A 4/1990 Katogi et al. .......... 123/406.32
4,926,330 A 5/1990 Abe et al. ............. 364/424.03
4,929,931 A 5/1990 McCuen ..................... 340/636
4,931,738 A 6/1990 MacIntyre et al. .......... 324/435
4,933,845 A 6/1990 Hayes ........................ 710/104
4,934,957 A 6/1990 Bellusci ...................... 439/504
4,937,528 A 6/1990 Palanisamy ................. 324/430
4,947,124 A 8/1990 Hauser ....................... 324/430
4,949,046 A 8/1990 Seyfang ...................... 324/427
4,956,597 A 9/1990 Heavey et al. .............. 320/129
4,968,941 A 11/1990 Rogers ....................... 324/428
4,968,942 A 11/1990 Palanisamy ................. 324/430
5,004,979 A 4/1991 Marino et al. .............. 324/160
5,032,825 A 7/1991 Xuznicki .................... 340/636
5,037,778 A 8/1991 Stark et al. ................. 437/216
5,047,722 A 9/1991 Wurst et al. ................ 324/430
5,081,565 A 1/1992 Nabha et al. ............... 362/465
5,087,881 A 2/1992 Peacock ..................... 324/378
5,095,223 A 3/1992 Thomas ...................... 307/110
5,108,320 A 4/1992 Kimber ...................... 439/883
5,126,675 A 6/1992 Yang .......................... 324/435
5,140,269 A 8/1992 Champlin ................... 324/433
5,144,218 A 9/1992 Bosscha ..................... 320/139
5,144,248 A 9/1992 Alexandres et al. ........ 324/428
5,159,272 A 10/1992 Rao et al. ................... 324/429
5,160,881 A 11/1992 Schramm et al. .............. 322/7
5,170,124 A 12/1992 Blair et al. ................. 324/434
5,179,335 A 1/1993 Nor ........................... 320/159
5,194,799 A 3/1993 Tomantschger ............. 320/103
5,204,611 A 4/1993 Nor et al. ................... 320/145
5,214,370 A 5/1993 Harm et al. ................ 320/152
5,214,385 A 5/1993 Gabriel et al. .............. 324/434
5,241,275 A 8/1993 Fang .......................... 324/430
5,254,952 A 10/1993 Salley et al. ................ 324/429
5,266,880 A 11/1993 Newland .................... 320/125
5,281,919 A 1/1994 Palanisamy ................. 324/427
5,281,920 A 1/1994 Wurst ......................... 324/430
5,295,078 A 3/1994 Stich et al. ................. 320/136
5,298,797 A 3/1994 Redl .......................... 327/387
5,300,874 A 4/1994 Shimamoto et al. ........ 320/106
5,302,902 A 4/1994 Groehl ....................... 324/434
5,313,152 A 5/1994 Wozniak et al. ............ 320/118
5,315,287 A 5/1994 Sol ........................... 340/455
5,321,626 A 6/1994 Palladino ..................... 702/63
5,321,627 A 6/1994 Reher ......................... 364/483
5,323,337 A 6/1994 Wilson et al. .............. 364/574
5,325,041 A 6/1994 Briggs ........................ 320/149
5,331,268 A 7/1994 Patino et al. ............... 320/158
5,336,993 A 8/1994 Thomas et al. .......... 324/158.1
5,338,515 A 8/1994 Dalla Betta et al. .......... 422/95
5,339,018 A 8/1994 Brokaw ...................... 320/147
5,343,380 A 8/1994 Champlin .................... 363/46
5,347,163 A 9/1994 Yoshimura ................... 307/66
5,352,968 A 10/1994 Reni et al. .................. 320/136
5,357,519 A * 10/1994 Martin et al. ................. 714/25
5,365,160 A 11/1994 Leppo et al. ............... 320/160
5,365,453 A 11/1994 Startup et al. .............. 320/136
5,369,364 A 11/1994 Renirie et al. .............. 324/430
5,381,096 A 1/1995 Hirzel ........................ 324/427
5,410,754 A 4/1995 Klotzbach et al. .......... 370/466
5,412,308 A 5/1995 Brown ....................... 323/267
5,412,323 A 5/1995 Kato et al. .................. 324/429
5,426,371 A 6/1995 Salley et al. ................ 324/429
5,426,416 A 6/1995 Jefferies et al. ............ 340/664
5,432,025 A 7/1995 Cox ............................ 429/65
5,432,426 A 7/1995 Yoshida ...................... 320/160
5,434,495 A 7/1995 Toko .......................... 320/135
5,435,185 A 7/1995 Eagan ......................... 73/587
5,442,274 A 8/1995 Tamai ........................ 320/146
5,445,026 A 8/1995 Eagan ......................... 73/591
5,449,996 A 9/1995 Matsumoto et al. ........ 320/148
5,449,997 A 9/1995 Gilmore et al. ............. 320/148
5,451,881 A 9/1995 Finger ........................ 324/433
5,453,027 A 9/1995 Buell et al. ................. 439/433
5,457,377 A 10/1995 Jonsson ............... 320/DIG. 21
5,469,043 A 11/1995 Cherng et al. .............. 320/161
5,485,090 A 1/1996 Stephens .................... 324/433
5,488,300 A 1/1996 Jamieson .................... 324/432
5,519,383 A 5/1996 De La Rosa ................ 340/636
5,528,148 A 6/1996 Rogers ....................... 320/137
5,537,967 A 7/1996 Tashiro et al. ........... 123/192.1
5,541,489 A 7/1996 Dunstan ..................... 320/134
5,546,317 A 8/1996 Andrieu ....................... 702/63
5,548,273 A 8/1996 Nicol et al. ................. 340/439
5,550,485 A 8/1996 Falk ........................... 324/772
5,561,380 A 10/1996 Sway-Tin et al. ........... 324/509
5,562,501 A 10/1996 Kinoshita et al. ........... 439/852
5,563,496 A 10/1996 McClure ..................... 320/128
5,572,136 A 11/1996 Champlin ................... 324/426
5,574,355 A 11/1996 McShane et al. ........... 320/161
5,578,915 A 11/1996 Crouch, Jr. et al. ......... 324/428
5,583,416 A 12/1996 Klang ........................ 320/160
5,585,728 A 12/1996 Champlin ................... 324/427
5,589,757 A 12/1996 Klang ........................ 320/160
5,592,093 A 1/1997 Klingbiel .................... 324/426
5,592,094 A 1/1997 Ichikawa .................... 324/427
5,596,260 A 1/1997 Moravec et al. ............ 320/135
5,598,098 A 1/1997 Champlin ................... 324/430
5,602,462 A 2/1997 Stich et al. ................. 323/258
5,606,242 A 2/1997 Hull et al. .................. 320/106
5,614,788 A 3/1997 Mullins et al. ............... 315/82
5,621,298 A 4/1997 Harvey ....................... 320/134
5,633,985 A 5/1997 Severson et al. ........... 704/267

| | | | | |
|---|---|---|---|---|
| 5,637,978 | A | 6/1997 | Kellett et al. | 320/104 |
| 5,642,031 | A | 6/1997 | Brotto | 320/152 |
| 5,650,937 | A | 7/1997 | Bounaga | 702/6 |
| 5,652,501 | A | 7/1997 | McClure et al. | 320/118 |
| 5,653,659 | A | 8/1997 | Kunibe et al. | 477/111 |
| 5,654,623 | A | 8/1997 | Shiga et al. | 320/106 |
| 5,656,920 | A | 8/1997 | Cherng et al. | 320/161 |
| 5,661,368 | A | 8/1997 | Deol et al. | 315/82 |
| 5,675,234 | A | 10/1997 | Greene | 320/DIG. 18 |
| 5,677,077 | A | 10/1997 | Faulk | 429/90 |
| 5,699,050 | A | 12/1997 | Kanazawa | 340/636 |
| 5,701,089 | A | 12/1997 | Perkins | 324/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/116 |
| 5,711,648 | A | 1/1998 | Hammerslag | 414/800 |
| 5,717,336 | A | 2/1998 | Basell et al. | 324/430 |
| 5,717,937 | A | 2/1998 | Fritz | 320/128 |
| 5,739,667 | A | 4/1998 | Matsuda et al. | 320/128 |
| 5,745,044 | A | 4/1998 | Hyatt, Jr. et al. | 340/5.23 |
| 5,747,909 | A | 5/1998 | Syverson et al. | 310/156.56 |
| 5,747,967 | A | 5/1998 | Muljadi et al. | 320/148 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,978 | A | 6/1998 | Becker | 324/430 |
| 5,780,974 | A | 7/1998 | Pabla et al. | 315/82 |
| 5,780,980 | A | 7/1998 | Naito | 318/139 |
| 5,789,899 | A | 8/1998 | van Phuoc et al. | 320/112 |
| 5,793,359 | A | 8/1998 | Ushikubo | 345/169 |
| 5,796,239 | A | 8/1998 | van Phuoc et al. | 320/107 |
| 5,808,469 | A | 9/1998 | Kopera | 324/434 |
| 5,818,234 | A | 10/1998 | McKinnon | 324/433 |
| 5,821,756 | A | 10/1998 | McShane et al. | 324/430 |
| 5,821,757 | A | 10/1998 | Alvarez et al. | 324/434 |
| 5,825,174 | A | 10/1998 | Parker | 324/106 |
| 5,831,435 | A | 11/1998 | Troy | 324/426 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,872,443 | A | 2/1999 | Williamson | 320/160 |
| 5,872,453 | A | 2/1999 | Shimoyama et al. | 324/431 |
| 5,895,440 | A | 4/1999 | Proctor et al. | 702/63 |
| 5,912,534 | A | 6/1999 | Benedict | 315/82 |
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,951,229 | A | 9/1999 | Hammerslag | 414/398 |
| 5,961,561 | A | 10/1999 | Wakefield, II | 701/29 |
| 5,961,604 | A | 10/1999 | Anderson et al. | 709/229 |
| 5,969,625 | A | 10/1999 | Russo | 340/636.19 |
| 5,978,805 | A | 11/1999 | Carson | 707/10 |
| 5,982,138 | A | 11/1999 | Krieger | 320/105 |
| 6,002,238 | A | 12/1999 | Champlin | 320/134 |
| 6,005,759 | A | 12/1999 | Hart et al. | 361/66 |
| 6,008,652 | A | 12/1999 | Theofanopoulos et al. | 324/434 |
| 6,009,369 | A | 12/1999 | Boisvert et al. | 701/99 |
| 6,016,047 | A | 1/2000 | Notten et al. | 320/137 |
| 6,031,354 | A | 2/2000 | Wiley et al. | 320/116 |
| 6,031,368 | A | 2/2000 | Klippel et al. | 324/133 |
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurie et al. | 320/112 |
| 6,072,300 | A | 6/2000 | Tsuji | 320/116 |
| 6,081,098 | A | 6/2000 | Bertness et al. | 320/134 |
| 6,081,109 | A | 6/2000 | Seymour et al. | 324/127 |
| 6,091,238 | A | 7/2000 | McDermott | 324/207.2 |
| 6,091,245 | A | 7/2000 | Bertness | 324/426 |
| 6,094,033 | A | 7/2000 | Ding et al. | 320/132 |
| 6,100,670 | A | 8/2000 | Levesque | 320/150 |
| 6,104,167 | A | 8/2000 | Bertness et al. | 320/132 |
| 6,114,834 | A | 9/2000 | Parise | 320/109 |
| 6,137,269 | A | 10/2000 | Champlin | 320/150 |
| 6,140,797 | A | 10/2000 | Dunn | 320/105 |
| 6,144,185 | A | 11/2000 | Dougherty et al. | 320/132 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,181,545 | B1 | 1/2001 | Amatucci et al. | 361/502 |
| 6,211,651 | B1 | 4/2001 | Nemoto | 320/133 |
| 6,215,275 | B1 | 4/2001 | Bean | 320/106 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,332 | B1 | 5/2001 | Conkright et al. | 340/3.1 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,271,643 | B1 | 8/2001 | Becker et al. | 320/112 |
| 6,275,008 | B1 | 8/2001 | Arai et al. | 320/132 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B1 | 10/2001 | Bertness | 324/430 |
| 6,313,607 | B1 | 11/2001 | Champlin | 320/132 |
| 6,313,608 | B1 | 11/2001 | Varghese et al. | 32/132 |
| 6,316,914 | B1 | 11/2001 | Bertness | 320/134 |
| 6,323,650 | B1 | 11/2001 | Bertness et al. | 324/426 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B1 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,384,608 | B1 | 5/2002 | Namaky | 324/430 |
| 6,388,448 | B1 | 5/2002 | Cervas | 324/426 |
| 6,392,414 | B1 | 5/2002 | Bertness | 324/429 |
| 6,396,278 | B1 | 5/2002 | Makhija | 324/402 |
| 6,411,098 | B1 | 6/2002 | Laletin | 324/436 |
| 6,417,669 | B1 | 7/2002 | Champlin | 324/426 |
| 6,424,157 | B1 | 7/2002 | Gollomp et al. | 324/430 |
| 6,424,158 | B1 | 7/2002 | Klang | 324/433 |
| 6,441,585 | B1 | 8/2002 | Bertness | 320/132 |
| 6,445,158 | B1 | 9/2002 | Bertness et al. | 320/104 |
| 6,449,726 | B1 | 9/2002 | Smith | 713/340 |
| 6,456,045 | B1 | 9/2002 | Troy et al. | 320/139 |
| 6,466,025 | B1 | 10/2002 | Klang | 324/429 |
| 6,466,026 | B1 | 10/2002 | Champlin | 324/430 |
| 6,495,990 | B1 | 12/2002 | Champlin | 320/132 |

| | | | | |
|---|---|---|---|---|
| 6,526,361 | B1 | 2/2003 | Jones et al. | 702/63 |
| 6,531,848 | B1 | 3/2003 | Chitsazan et al. | 320/153 |
| 6,534,993 | B1 | 3/2003 | Bertness | 324/433 |
| 6,544,078 | B1 | 4/2003 | Palmisano et al. | 439/762 |
| 6,556,019 | B1 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,586,941 | B1 | 7/2003 | Bertness et al. | 324/426 |
| 6,597,150 | B1 | 7/2003 | Bertness et al. | 320/104 |
| 6,600,815 | B1 | 7/2003 | Walding | 379/93.07 |
| 6,618,644 | B1 | 9/2003 | Bean | 700/231 |
| 6,628,011 | B1 | 9/2003 | Droppo et al. | 307/43 |
| 6,629,054 | B1 | 9/2003 | Makhija et al. | 702/113 |
| 6,667,624 | B1 | 12/2003 | Raichle et al. | 324/522 |
| 6,679,212 | B1 | 1/2004 | Kelling | 123/179.28 |
| 6,777,945 | B1 | 8/2004 | Roberts et al. | 324/426 |
| 2002/0010558 | A1 | 1/2002 | Bertness et al. | 702/63 |
| 2002/0030495 | A1 | 3/2002 | Kechmire | 324/427 |
| 2002/0050163 | A1 | 5/2002 | Makhija et al. | 73/116 |
| 2002/0171428 | A1 | 11/2002 | Bertness | 324/426 |
| 2002/0176010 | A1 | 11/2002 | Wallach et al. | 348/362 |
| 2003/0025481 | A1 | 2/2003 | Bertness | 324/427 |
| 2003/0036909 | A1 | 2/2003 | Kato | 704/275 |
| 2003/0184262 | A1 | 10/2003 | Makhija | 320/130 |
| 2003/0184306 | A1 | 10/2003 | Bertness et al. | 324/426 |
| 2003/0194672 | A1 | 10/2003 | Roberts et al. | 431/196 |
| 2004/0000590 | A1 | 1/2004 | Raichle et al. | 235/462.01 |
| 2004/0000891 | A1 | 1/2004 | Raichle et al. | 320/107 |
| 2004/0000893 | A1 | 1/2004 | Raichle et al. | 320/135 |
| 2004/0000913 | A1 | 1/2004 | Raichle et al. | 324/426 |
| 2004/0000915 | A1 | 1/2004 | Raichle et al. | 324/522 |
| 2004/0002824 | A1 | 1/2004 | Raichle et al. | 702/63 |
| 2004/0002825 | A1 | 1/2004 | Raichle et al. | 702/63 |
| 2004/0002836 | A1 | 1/2004 | Raichle et al. | 702/188 |
| 2004/0049361 | A1 | 3/2004 | Hamdan et al. | 702/115 |
| 2004/0051533 | A1 | 3/2004 | Namaky | 324/426 |
| 2004/0054503 | A1 | 3/2004 | Namaky | 702/183 |

FOREIGN PATENT DOCUMENTS

| | | | |
|---|---|---|---|
| EP | 0 022 450 | A1 | 1/1981 |
| EP | 0 637 754 | A1 | 2/1995 |
| EP | 0 772 056 | A1 | 5/1997 |
| FR | 2 749 397 | | 12/1997 |
| GB | 2 088 159 | A | 6/1982 |
| GB | 2 246 916 | A | 10/1990 |
| GB | 2 387 235 | A | 10/2003 |
| JP | 59-17892 | | 1/1984 |
| JP | 59-17893 | | 1/1984 |
| JP | 59-17894 | | 1/1984 |
| JP | 59017894 | | 1/1984 |
| JP | 59215674 | | 12/1984 |
| JP | 60225078 | | 11/1985 |
| JP | 62-180284 | | 8/1987 |
| JP | 63027776 | | 2/1988 |
| JP | 03274479 | | 12/1991 |
| JP | 03282276 | | 12/1991 |
| JP | 4-8636 | | 1/1992 |
| JP | 04095788 | | 3/1992 |
| JP | 04131779 | | 5/1992 |
| JP | 04372536 | | 12/1992 |
| JP | 5216550 | | 8/1993 |
| JP | 7-128414 | | 5/1995 |
| JP | 09061505 | | 3/1997 |
| JP | 10056744 | | 2/1998 |
| JP | 10232273 | | 9/1998 |
| JP | 11103503 | A | 4/1999 |
| RU | 2089015 | C1 | 8/1997 |
| WO | WO 93/22666 | | 11/1993 |
| WO | WO 94/05069 | | 3/1994 |
| WO | WO 97/44652 | | 11/1997 |
| WO | WO 98/04910 | | 2/1998 |
| WO | WO 98/58270 | | 12/1998 |
| WO | WO 99/23738 | | 5/1999 |
| WO | WO 00/16083 | | 3/2000 |
| WO | WO 00/62049 | | 10/2000 |
| WO | WO 00/67359 | | 11/2000 |
| WO | WO 01/59443 | | 2/2001 |
| WO | WO 00/16614 | A1 | 3/2001 |
| WO | WO 00/16615 | A1 | 3/2001 |
| WO | WO 01/51947 | | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Betteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621. 355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Linear Brief 5, Mar. 1969.

Burr-Brown Corporation, "Design A 60 Hz Notch Filter with the UAF42", Jan. 1994, AB-071.

National Semiconductor Corporaton, "LMF90-4$^{th}$-Order Elliptic Notch Filter", RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC—DC Converts Allows Use of Single Battery", *Electronix Express*, downloaded from http://www.elexp.com/t_dc-dc.htm, undated.

"DC—DC Converter Basics", *Power Designers*, downloaded from http://www.powederdesigners.com/InforWeb.design_center/articles/DC-DC/conveter.shtm, undated.

"Notification of Transmittal of The International Search Report or the Declaration", PCT/US02/29461.
"Notification of Transmittal of The International Search Report or the Declaration", PCT/US03/07546.
"Notification on Transmittal of The International Search Report or the Declaration", PCT/US03/06577.
"Notification on Transmittal of The International Search Report or the Declaration", PCT/US03/07837.
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
"Notification of Transmittal of The International Search Report or the Declaration", PCT/US02/29461.
"Dynamic modelling of lead/acid batteries using impedance spectroscopy for parameter indetification", Journal of Power Sources, pp. 69-84, (1997).
"A review of impedance measurements for determination of the state-of-charge or state-of-health of secondary batteries", Journal of Power Sources, pp. 59-69, (1998).
"Improved Impedance Spectroscopy Technique For Status Determination of Production Li/$SO_2$ Batteries" Terrill Atwater et al., pp. 10-113, (1992).
"Search Report Under Section 17" for Great Britain Application No. GB0421447.4. (Jan. 28, 2005).
"Results of Discrete Frequency Immittance Spectroscopy (DFIS) Measurements of Lead Acid Batteries", by K.S. Champlin et al., *Prodeedings of 23rd International Teleco Conference* (*INTELEC*), published Oct. 2001, IEE, pp. 433-440.
"Examination Report" from the U.K. Patent Office for U.K. App. No. 0417678.0.

* cited by examiner

ELECTRONIC BATTERY TESTER WITH DATA BUS FOR REMOVABLE MODULE

The present application is a Divisional of U.S. patent application Ser. No. 10/280,186, filed Oct. 25, 2002 now U.S. Pat. No. 6,759,849, which is a continuation-in-part of and claims priority of U.S. patent application Ser. No. 09/816,768, filed Mar. 23, 2001, now U.S. Pat. No. 6,586,941, which is based on and claims the benefit of U.S. provisional patent application Ser. No. 60/192,222, filed Mar. 27, 2000, the content of which is hereby incorporated by reference in its entirety.

BACKGROUND OF THE INVENTION

The present invention relates to battery testers. More specifically, the present invention relates to electronic battery testers used for testing storage batteries.

Storage batteries are an important component of modern automotive vehicles. Vehicles with internal combustion engines use such batteries to start the engine or run electrical equipment when the engine is not operating. Electric vehicles use such batteries as a source of power. It is frequently desirable to test storage batteries so that a failing battery can be identified and replaced prior to its ultimate failure, so that a battery with a low state of charge can be recharged, etc. Battery testing typically can be reconfigured after their manufacture.

Many battery testing techniques have been developed through the years. Midtronics, Inc. of Willowbrook, Ill. and Dr. Keith S. Champlin have been pioneers in battery testing and related technologies. Examples of their work are shown in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONI- CALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Ser. No. 09/703,270, filed Oct. 31, 2000, entitled ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, entitled PROGRAMMABLE CURRENT EXCITER FOR MEASURING AC IMMITTANCE OF CELLS AND BATTERIES; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 60/379,281, filed May 8, 2002, entitled METHOD FOR DETERMINING BATTERY STATE OF CHARGE; U.S. Ser. No. 10/143,307, filed May 10, 2002, entitled ELECTRONIC BATTERY TESTER; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY, which are incorporated herein in their entirety.

SUMMARY OF THE INVENTION

An electronic battery tester is provided for testing storage batteries. Battery test circuitry is configured to couple to the storage battery and digital processor determines a condition of the battery using the battery test circuitry. A data bus couples to the digital processor and is configured to carry data. A connector couples to the data bus and is configured to receive a removable digital module. The connector includes, electrical connections which couple the data bus to the removable module.

DETAILED DESCRIPTION OF THE PREFERRED EMBODIMENTS

The present invention provides an electronic battery tester for testing storage batteries in which removable modules can be selectively coupled to the electronic battery tester to extend the functionality of the device. In various aspects, the invention includes an electronic battery tester adapted to couple to a removable module, a removable module itself and a combination of an electronic battery tester and a removable module. The following is a more detailed description of the invention. However, in broad aspects, the present invention is not limited to the specific configurations or example modules set forth herein.

Figure 1:
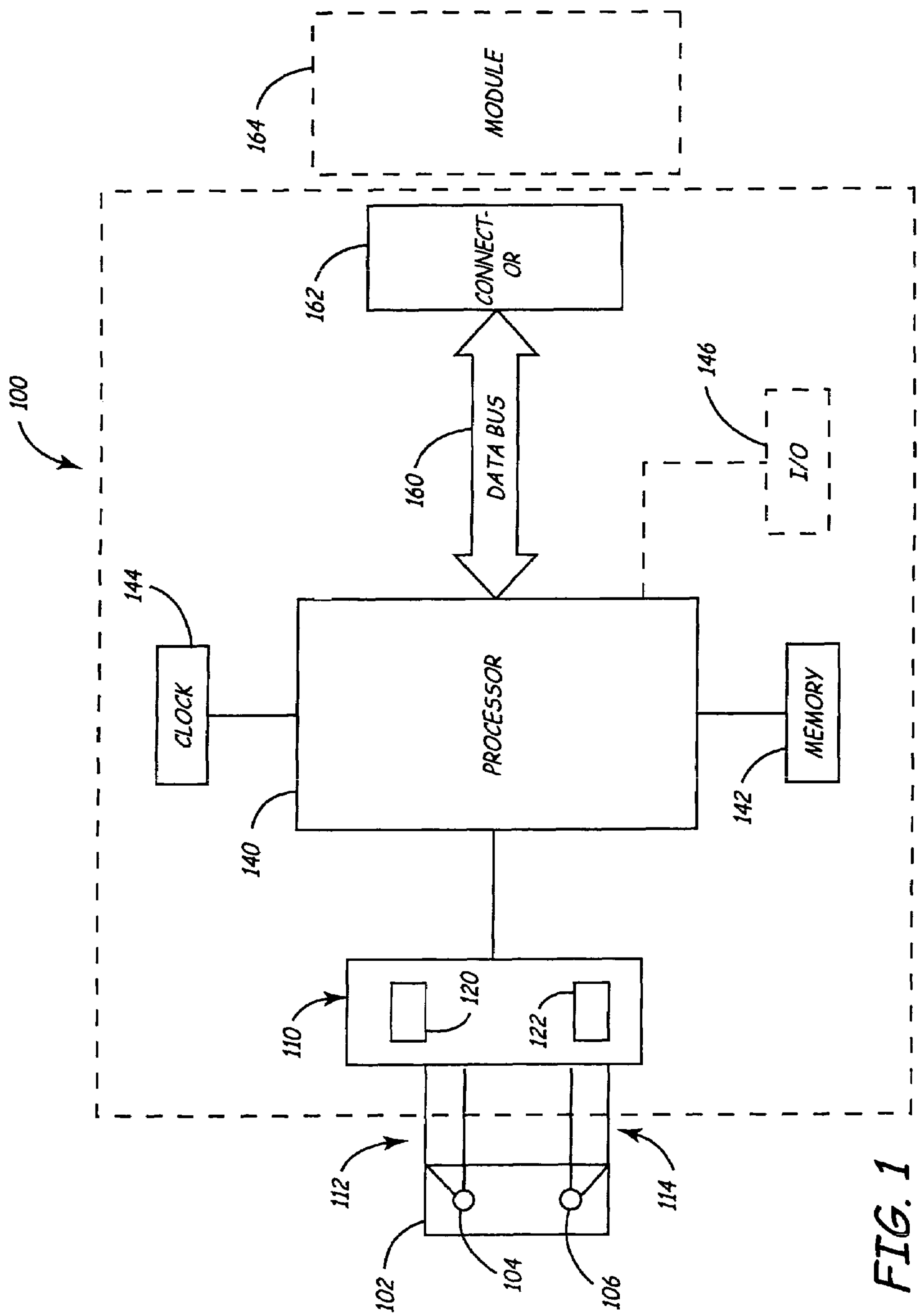
FIG. 1 is a simplified block diagram of a battery tester and a removable module.

FIG. 1 is a simplified diagram of a battery tester 100 configured to test a storage battery 102. Storage battery 102 includes terminals 104 and 106 and may comprise a single cell or a plurality of cells. Battery tester 100 includes battery test circuitry 110 which electrically couples to battery 102 to terminals 104 and. 106 of battery 102 through Kelvin connections 112 and 114, respectively. In one aspect, the connection between test circuitry 110 and battery 102 can be through any appropriate means and is not limited to Kelvin connections. For example, a split Kelvin configuration, non-Kelvin connections and/or current sensors can be used. In one specific embodiment circuitry 110 includes a forcing function source 120 configured to apply a forcing function signal to battery 102 through Kelvin connections 112 and 114. In such an embodiment, circuitry 110 may also include a response sensor 122 electrically coupled to battery 102 through Kelvin connections 112, 114. The response sensor 122 is configured to sense an electrical response of battery 102 to the applied forcing function signal. The forcing function signal includes a time varying component and can be applied either by injecting a signal or selectively applying a load to the battery 102.

A digital processor 140 is electrically coupled to circuitry 110 and is configured to test the storage battery 102. Processor 140 operates in accordance with instructions stored in some type of a memory 142 and at a rate determined by clock 144. In one specific embodiment, processor 140 measures a dynamic parameter of battery 102. An optional input/output (I/O) 146 is provided for coupling to other equipment and/or for operation by a user.

In accordance with the present invention, a data bus 160 is provided which couples processor 140 to a connector 162. The data bus 160 can carry digital or analog data along with analog signals or electrical power as desired. Connector 162 is configured to couple to a removable module 164 which can be selectively coupled to battery tester 100 to add functionality to battery tester 100.

Figure 2:
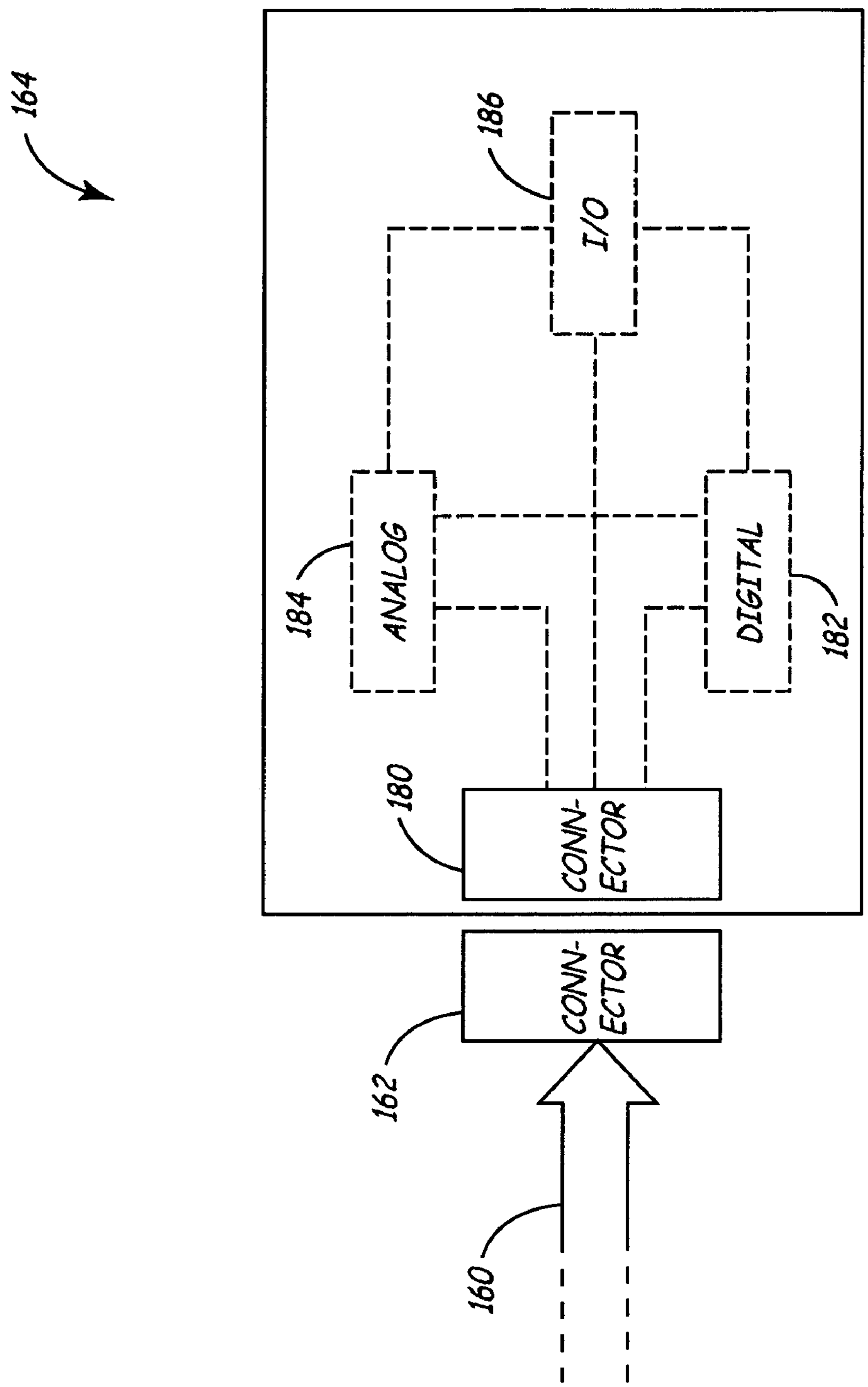
FIG. 2 is a more detailed block diagram of the removable module shown in FIG. 1.

FIG. 2 is a simplified block diagram of one example of a removable module 164 and shows various component blocks which can be included in module 164. Module 164 includes a connector 180 configured to mate with connector 162 of battery tester 100 and thereby provide a connection to data bus 160. In one aspect, optional digital circuitry 182 is provided and coupled to data bus 160 through connectors 180 and 162. Similarly, in another example aspect, optional analog circuitry 184 is provided and can also couple to data bus 160 through connectors 180 and 162. Another optional circuit is illustrated as input/output circuit 186 which can couple to data bus 160 through connectors 180 and 162. Removable module 164 can include any combination of circuits 182, 184 and 186. Further, these circuits can optionally interconnect with one another.

Figure 3:
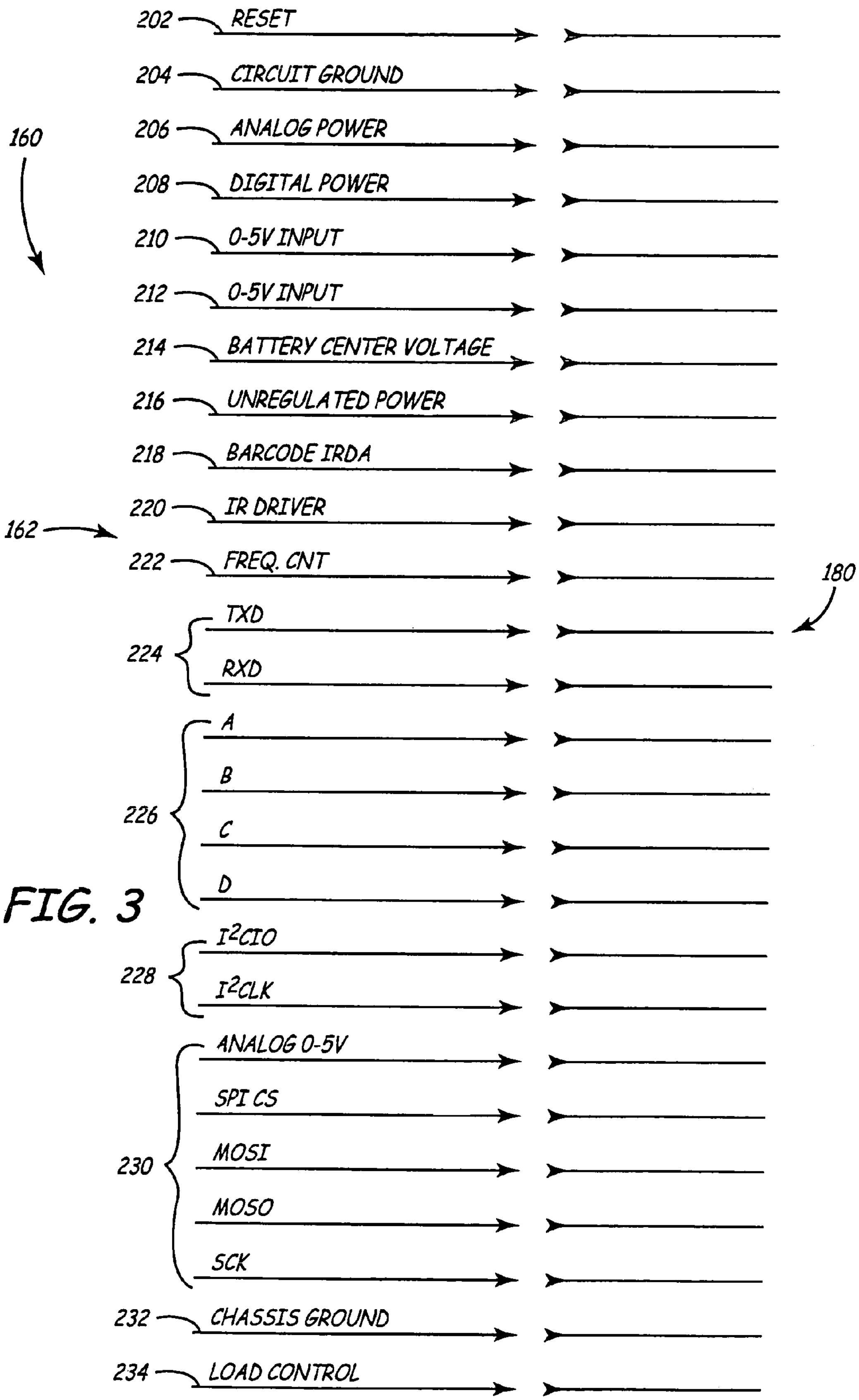
FIG. 3 is an electrical schematic diagram showing electrical lines or connections in the connector which couples the battery tester to the removable module illustrated in FIG. 1.

FIG. 3 is a electrical diagram showing specific electrical connections provided in one embodiment of connectors 162 and 180. These connections are shown for example only and the present invention is not limited to this particular configuration. The electrical connections shown in FIG. 3 form the data bus 160 illustrated in FIGS. 1 and 2.

A reset connection 202 carries a reset signal between battery tester 100 and module 164 such that either unit can cause a reset to occur in the other. This is useful if one of the units is not responding. Line 204 carries a circuit ground while lines 206 and 208 carry analog and digital power, respectively, from the battery tester 100 to the module 164. Lines 210 and 212 provide analog inputs from module 164 to battery tester 100. In a specific example, these inputs can range between 0 and 5 and can be configured to represent a variable in an analog format. Line 214 carries a battery center voltage connection and is used to couple to a center terminal of a multi-terminal battery. Unregulated power is provided on line 216. A bar code/IRDA connection is provided on line 218 and an IR driver connection is provided on line 220. The bar codes/IRDA connection can be used to receive data from module 164 and the IR driver line 220 can be used to send data to an external device, such as a printer, through module 164.

A frequency count line 222 is provided for transferring data relating to frequency. TXD and RXD lines are provided on a serial connection 224 for transferring data serially between module 164 and battery tester 100. Connectors 226 provide a connection through Kelvin connectors 112 and 114 and are identified as A, B, C and D. This allows module 164 to have direct access to the Kelvin connectors 112 and 114.

A two-line data bus connection 228 is provided in accordance with the $I^2C$ standard for bi-directional communication between battery tester 100 and module 164. Additionally, five lines are provided for a data bus 230 which operates in accordance with the SPI standard for data communication between battery tester 100 and module 164. A chassy ground is provided on line 232 and a load control is provided on line 234. Load control line 234 is used to control application of a load contained in module 164.

The example data bus 160 shown in FIG. 3 provides a number of different electrical connections for sending signals between tester 100 and module 164. Depending on the particular signal lines being employed, tester 100 and module 164 should be configured appropriately. For example, if a serial bus 224 is used, processor 140 of battery tester 100 and digital circuitry 182 from module 164 should have appropriate circuitry to interface with such a serial connection.

In one embodiment, module 164 comprises a standard battery tester interface. For example, such an interface can provide a direct passthrough connection with no electronics itself and a standard battery interface is built into the main tester body.

In another example, module 164 comprises a 42 volt battery tester interface. In such an embodiment, the interface can provide voltage and/or conductance scaling by adjusting amplifiers and/or divider networks to scale a 42 volt input voltage, or other measurements such that they can be used with a standard battery tester interface. This allows a single test circuit to be used with differing battery types by scaling applied signals and/or measured values. This is not limited to the measurement of 42 volt batteries and can be applied to other battery sizes. In general, the battery test module can include circuitry which can scale a measurement.

Module 164 can comprise a hybrid vehicle interface. For example, instead of scaling a 42 volt battery voltage, a much high voltage can be scaled such as those present in hybrid vehicles, for example 250 to 400 volts.

Module 164 can comprise an OBDII connector such that battery tester 100 can access the OBDII data bus of a vehicle. In another example, module 164 comprises a multimeter to thereby add such functionality to battery tester 100. In such an example, Kelvin connectors 112 and 114 can be used to provide signals to module 164 through connection 226. The signals can be digitized using digital circuitry 182. This information is provided back to processor 140 and displayed or output on I/O 146. For example, voltage resistance or current can be measured. In a similar example, module 164 provides an oscilloscope function.

Communication functions can be provided through module 164 such as radio frequency or infrared and other wired or wireless communication I/O. For example, module 164 can provide a interface to a printer. In another example, module 164 includes a printer such that information can be printed directly.

Module 164 can include a memory which carries specific software to add additional software functionality to battery tester 100. Data security, encryption or software unlocking keys can also be provided by a memory in module 164.

Module 164 can include calibrated values such that specific calibrations can be performed on battery tester 100. For example, a calibration reference can be coupled to the tester 100. The value of the reference can be digitally communicated to the tester 100.

Module 164 can include additional processing circuitry to further process battery test data.

In one embodiment, analog circuitry 184 includes a large resistive load which can optionally be applied to battery 102 during a test. The load is configured to draw a large amount of current for performing a load test.

Removable module 164 can also provide a backup battery connection for operating circuitry of battery tester 100. A barcode reader can be included in module 164 such that module 164 can be used to read bar code information, for example on a vehicle or on a battery. This information can be used by the battery tester. 100 or stored for future use. A data port can be included in module 164, such as a USB port or a PCMCIA port. This allows the battery tester 100 to couple to widely available modular devices used with personal computers. The module 164 may contain additional memory for storage or data logging or a real time clock.

Module 164 can also contain circuitry or stored algorithms for performing additional tests such as testing the alternator of a vehicle or the starter, etc.

Figure 4A:
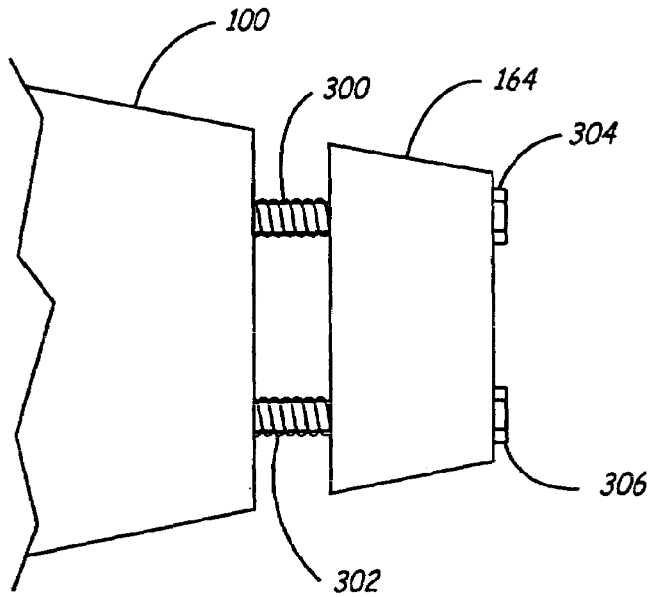
FIGS. 4A, 4B and 4C show couplings between the battery tester and removable module.
Figure 4B:
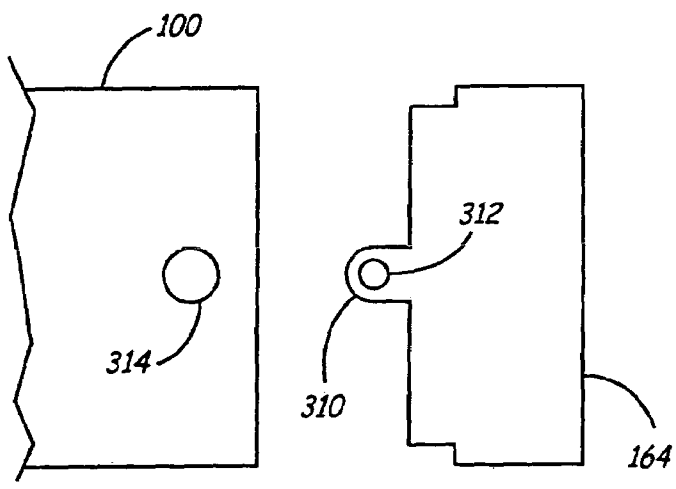
Figure 4C:
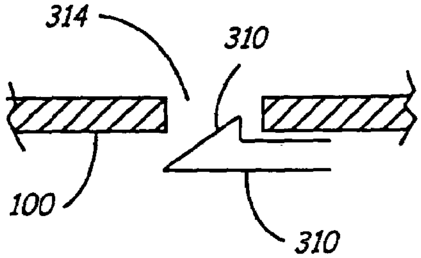

Removable module 164 can be coupled to measure battery tester 100 using any appropriate technique. For example, FIG. 4A is a side view showing battery test module 164 coupling to battery tester 100 through screws 300 and 302. Finger grips 304 and 306 can be used to manually tighten the screws 300, 302, respectively, by an operator. FIG. 4B is a side view shown another attachment technique in which a spring loaded members 310 includes a protrusion 312 which fits into a receptacle 314. A more detailed view is shown in the cross-sectional view of FIG. 4C. Other attachment techniques include separate screws or attachment elements, snap fit techniques, etc. The mechanisms can be separate elements, molded into the cases of battery tester 100 and/or removable module 164, etc.

Although the present invention has been described with reference to preferred embodiments, workers skilled in the art will recognize that changes may be made in form and detail without departing from the spirit and scope of the invention.

What is claimed is:

1. An electronic battery tester for testing a storage battery comprising:

a Kelvin connection configured to electrically couple to the storage battery;

a microprocessor configured to determine a dynamic parameter of the battery;

a data bus coupled to the microprocessor configured to carry data in the electronic battery tester;

a connector coupled to the data bus and configured to receive a removable digital module, the connector including electrical connections which couple the data bus to the removable module; and wherein the microprocessor is configured to couple to the removable module and send or receive data from the removable module on the data bus.

2. The apparatus of claim 1, wherein the data bus includes a serial connection.

3. The apparatus of claim 1, wherein the data bus includes electrical connections to first and second Kelvin connections.

4. The apparatus of claim 1, wherein the data bus includes a power supply connection.

5. The apparatus of claim 1, wherein the data bus includes a reset connection.

6. The apparatus of claim 1, wherein the data bus includes an analog voltage connection.

7. The apparatus of claim 1, wherein the data bus includes a bar code reader connection.

8. The apparatus of claim 1, wherein the data bus includes an infrared driver connection.

9. The apparatus of claim 1, wherein the data bus includes a frequency count connection.

10. The apparatus of claim 1, wherein the data bus includes an $I^2C$ connection.

11. The apparatus of claim 1, wherein the data bus includes an SPI connection.

12. The apparatus of claim 1, wherein the data bus includes a load control connection.

13. The apparatus of claim 1, wherein the microprocessor is configured to receive data from a vehicle through a connection to the removable module.

14. The apparatus of claim 1, wherein the microprocessor is configured to send data to a printer on the data bus.

15. The apparatus of claim 1, wherein the microprocessor is configured to receive software from the removable module through the data bus.

16. The apparatus of claim 1, wherein the microprocessor is configured to receive a software key from the removable module through the data bus.

17. The apparatus of claim 1, wherein the microprocessor is configured to calibrate measurements by coupling to a calibrated reference in the removable module.

18. A removable module configured to couple to the data bus through the connector of the battery tester of claim 1.

19. The apparatus of claim 18, wherein the module includes a memory.

20. The apparatus of claim 18, wherein the module includes test circuitry.

21. The apparatus of claim 18, wherein the module includes a printer.

22. The apparatus of claim 18, wherein the module is configured to couple to a printer.

23. The apparatus of claim 19, wherein the memory includes software.

24. The apparatus of claim 19, wherein the memory includes a software key.

25. The apparatus of claim 18, wherein the module includes a calibrated reference.

26. The apparatus of claim 18, wherein the module includes a resistive load.

27. The apparatus of claim 18 including a screw configured to attach the removable module to the battery tester.

28. The apparatus of claim 18 including a latch configured to attach the removable module to the battery tester.

29. The apparatus of claim 18 wherein the removable module includes circuitry configured to scale a test measurement.

30. An electronic battery tester for testing a storage battery comprising:

Kelvin connection means for electrically connecting to the battery;

a microprocessor means for determining a dynamic parameter of the battery;

a data bus means for carrying data in the electronic battery tester;

a connector means coupled to the data bus for connecting to removable digital module, the connector means including electrical connection means for coupling the data bus means to the removable module; and wherein the microprocessor means is further for sending or receiving data from the removable module on the data bus means.

* * * * *